(12) United States Patent
Lin et al.

(10) Patent No.: US 6,450,251 B1
(45) Date of Patent: Sep. 17, 2002

(54) HEAT REMOVAL SYSTEM

(75) Inventors: Yeu Lih Lin; Carey Lai, both of Taipei (TW); Zili Zhang, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/750,863

(22) Filed: Dec. 28, 2000

(51) Int. Cl.$^7$ ................................................. F24H 3/06
(52) U.S. Cl. ........................ 165/122; 361/695; 361/697; 165/80.3
(58) Field of Search .................. 165/80.3, 80.4, 165/185, 122; 361/704, 695, 707, 710, 697; 174/16.1; 257/719

(56) References Cited

U.S. PATENT DOCUMENTS

| | | | |
|---|---|---|---|
| 5,311,928 A | * | 5/1994 | Marton ........................ 165/80.3 |
| 5,823,249 A | * | 10/1998 | Batchelder ................. 165/80.3 |
| 6,097,601 A | * | 4/2000 | Lee ............................. 361/704 |
| 6,308,771 B1 | * | 10/2001 | Tavassoli .................. 165/80.3 |
| 6,327,148 B1 | * | 12/2001 | Tucker et al. ............... 361/704 |

* cited by examiner

*Primary Examiner*—Henry Bennett
*Assistant Examiner*—Terrell McKinnon
(74) *Attorney, Agent, or Firm*—Wei Te Chung

(57) ABSTRACT

A heat removal system includes a heat dissipation assembly (10) and a system fan (20) which cooperatively achieve optimized heat dissipation efficiency. The heat dissipation assembly includes a heat sink (12) and an angled fan (14). The heat sink includes a base (122) and a plurality of parallel fins (124). A slanted surface (126) is defined by a set of adjacent edges of the fins. The fan defines a through hole (142) at each of four corners thereof. Four screws (144) extend through the through holes, thus attaching the fan to the heat sink at the slanted surface. A rotational axis of the fan intersects a central portion of the base of the heat sink, which portion defines a region of highest temperature of the heat sink. The angled fan together with the system fan provide maximized cooling airflow.

6 Claims, 4 Drawing Sheets

HEAT REMOVAL SYSTEM

BACKGROUND OF THE INVENTION

1. Field of the Invention

The present invention relates to a heat removal system, and particularly to a heat removal system incorporating an angled fan and a system fan for cooperatively enhancing the efficiency of heat dissipation.

2. Related Art

Developments in today's highly information-intensive society have led to remarkable improvements in performances of electronic devices. Large amounts of heat are produced during operation of electronic devices such as CPUs. The heat must be quickly removed to prevent the system from becoming unstable or being damaged. Typically, a heat sink is attached to an outer surface of the electronic device to facilitate removal of heat therefrom. A fan is often attached to the heat sink to provide forced convection.

A conventional heat removal system is shown in FIG. 3. A horizontal fan 2 is mounted to fins of a heat sink, to force air to flow between the fins and toward a base of the heat sink. A system fan 5 is attached to a rear panel 4 of a computer enclosure 3. The horizontal fan 2 creates vertical forced convection, and the system fan 5 creates horizontal forced convection. However, portions of the vertical forced airflow rebound from the base of the heat sink, and the horizontal forced airflow interferes with portions of such rebounded airflow. Thus the overall efficiency of forced convection is reduced.

FIG. 4 shows another kind of conventional heat removal system, wherein a vertical fan 2' is attached to a side of a heat sink 6'. The fan 2' forces air to pass horizontally between fins 7' of the heat sink 6' in directions generally parallel to a base of the heat sink 6'. The hottest part of the heat sink 6' is the base, which is in thermal contact with a CPU. Airflow nearest the base is able to effect significant heat removal therefrom. However, other airflow farther away from the base always remains too far away from the base to effect significant heat removal therefrom. Furthermore, air adjacent the base is hottest, and tends to rise therefrom. Such rising air tends to push the horizontal airflow upwardly and away from the base, thereby further reducing the efficiency of heat removal from the base.

Thus, a heat removal system which optimizes the efficiency of forced convection is desired.

SUMMARY OF THE INVENTION

Accordingly, an object of the present invention is to provide a heat removal system which dissipates heat efficiently.

Another object of the present invention is to provide a heat removal system having improved forced convention.

To achieve the above-mentioned objects, a heat removal system comprises a heat dissipation assembly and a system fan which cooperatively achieve optimized heat dissipation efficiency. The heat dissipation assembly comprises a heat sink and an angled fan. The heat sink comprises a base and a plurality of parallel fins. A slanted surface is defined by a set of adjacent edges of the fins. The fan defines a through hole at each of four corners thereof. Four screws extend through the through holes, thus attaching the fan to the heat sink at the slanted surface. A rotational axis of the fan intersects a central portion of the base of the heat sink, which portion defines a region of highest temperature of the heat sink. The angled fan together with the system fan provide maximized cooling airflow.

Other objects, advantages and novel features of the present invention will be drawn from the following detailed embodiment of the present invention with attached drawings, in which:

DESCRIPTION OF THE PREFERRED EMBODIMENT

Figure 1:
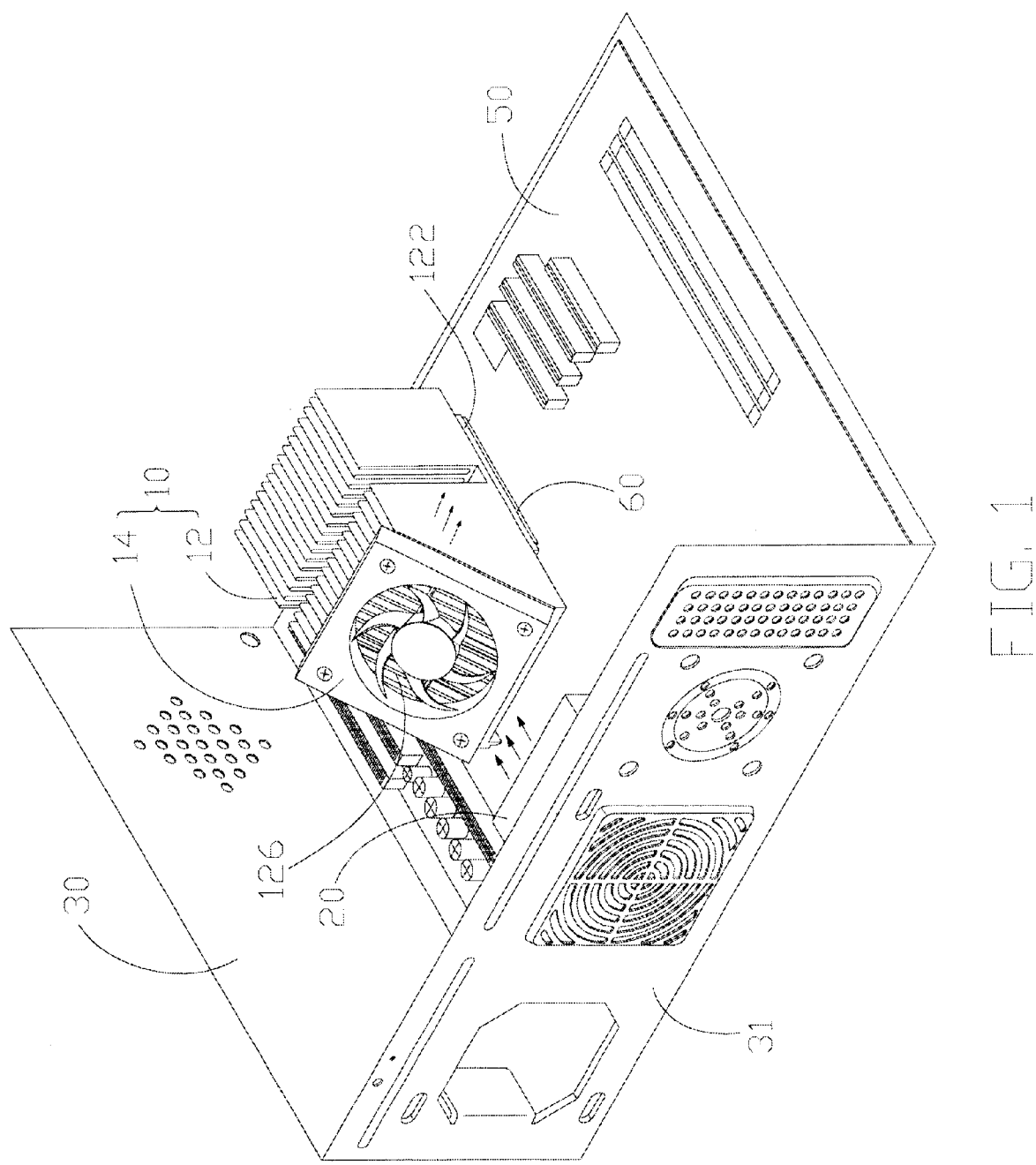
FIG. 1 is a perspective view of a heat removal system in accordance with the present invention, installed in a computer enclosure.
Figure 2:
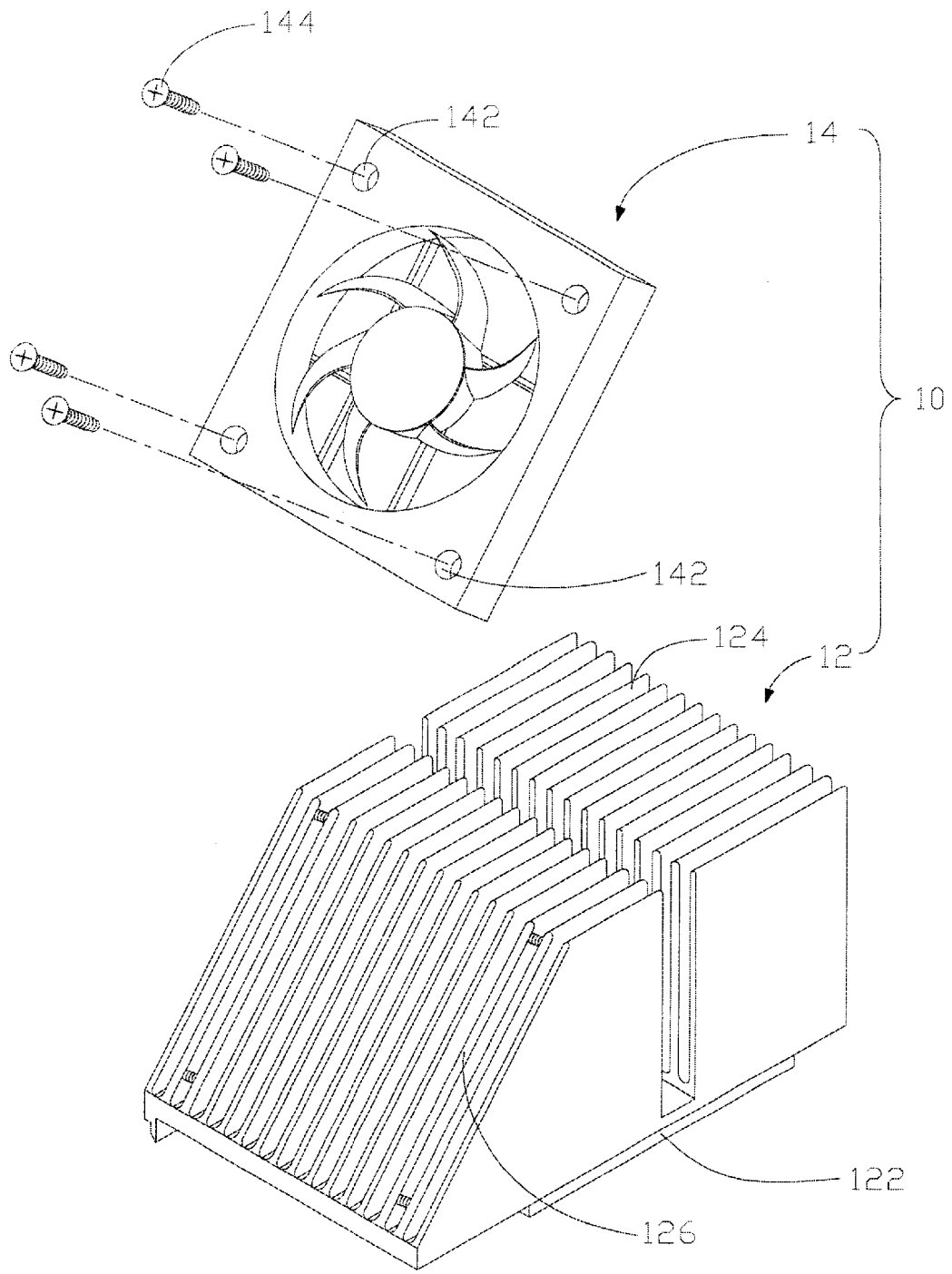
FIG. 2 is an exploded view of a heat dissipation assembly of the heat removal system of FIG. 1.
Figure 3:
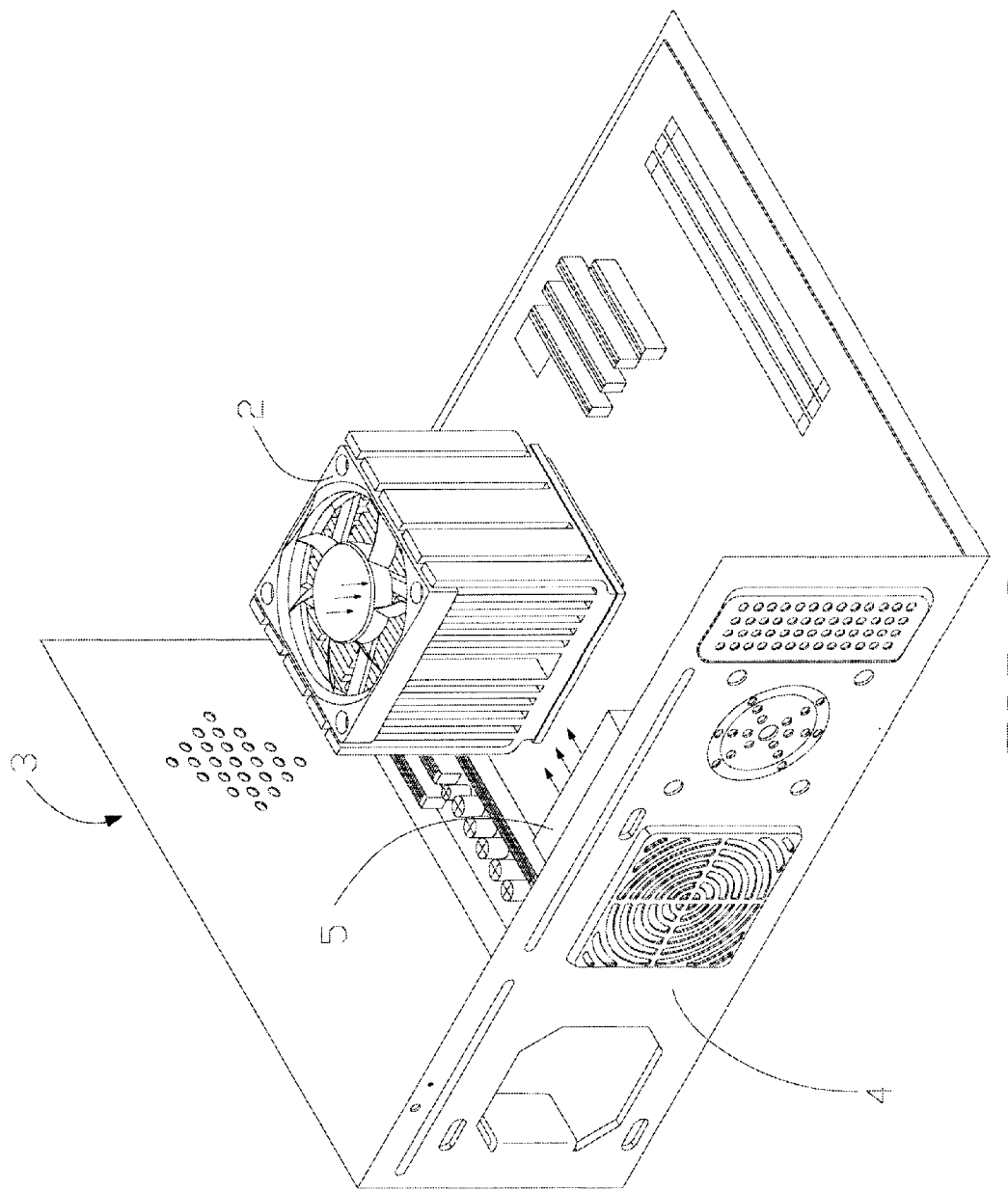
FIG. 3 is a perspective view of a conventional heat removal system, installed in a computer enclosure.
Figure 4:
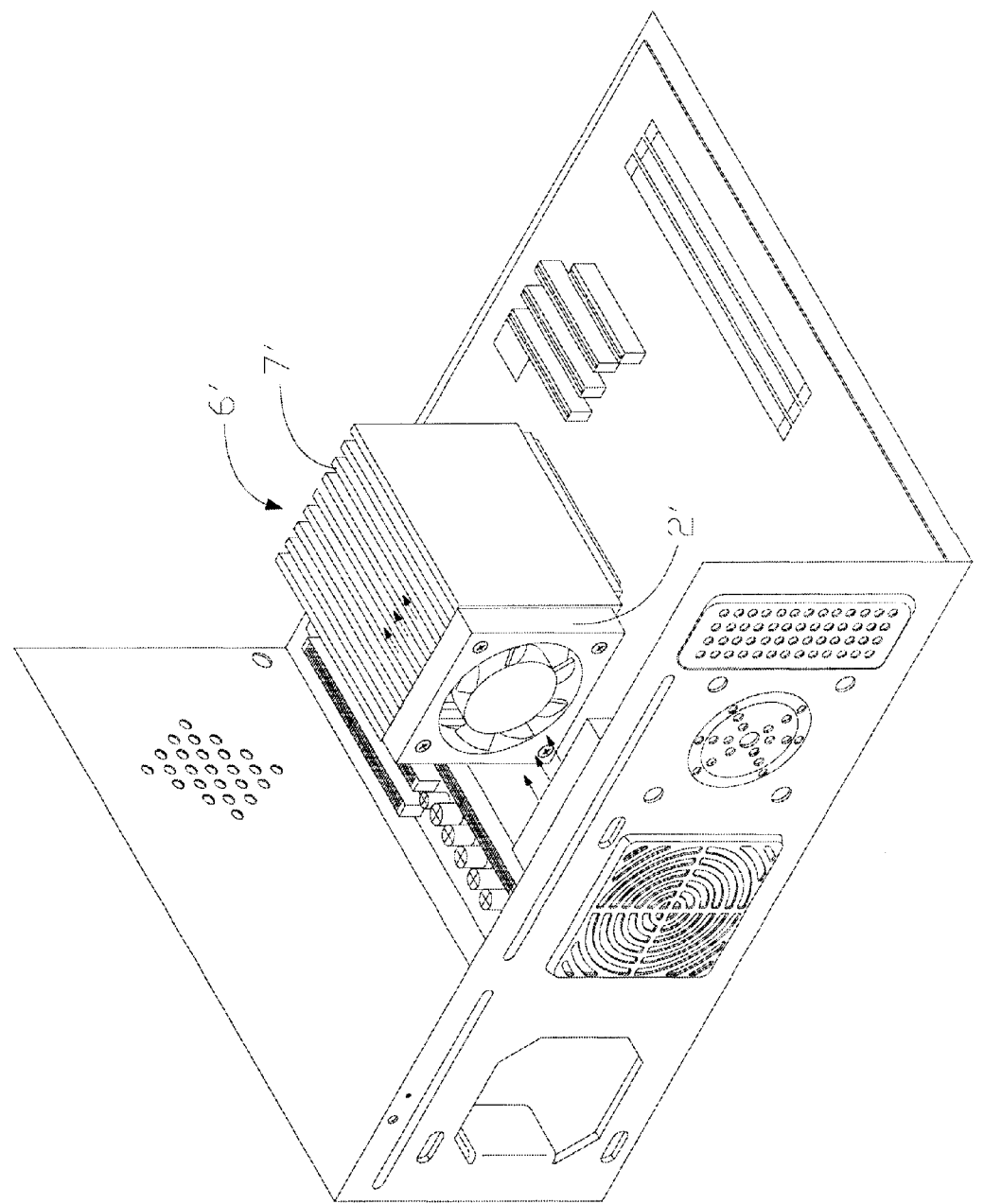
FIG. 4 is a perspective view of another conventional heat removal system, installed in a computer enclosure.

Referring to FIGS. 1 and 2, a heat removal system of the present invention includes a heat dissipation assembly 10 and a system fan 20. The heat dissipation assembly 10 includes a heat sink 12 and an angled fan 14.

The heat sink 12 includes a base 122, and a plurality of parallel fins 124 extending upwardly from the base 122. A set of adjacent edges of the fins 124 together define a slanted surface 126, the slanted surface 126 being at an acute angle to the base 122 and perpendicular to the fins 124. The slanted surface 126 is formed by machining. The angled fan 14 is generally box-shaped, and defines four through holes 142 at four corners thereof, respectively. Four screws 144 attach the angled fan 14 to the heat sink 12. A computer enclosure 30 comprises a rear panel 31 and a motherboard 50. A heat-generating electronic device such as a CPU 60 is mounted on the enclosure 30. A central portion (not labeled) of a top surface of the CPU 60 defines a region of highest temperature of the CPU 60.

In assembly, the system fan 20 is attached to the rear panel 31 of the enclosure 30, such that the system fan 20 is substantially opposite the CPU 60. The heat sink 12 is attached to the CPU 60 by conventional means. A central portion (not labeled) of the base 122 of the heat sink 12 is in thermal contact with the central portion (not labeled) of the CPU 60. The angled fan 14 is attached to the slanted surface 126 of the heat sink 12 as follows. The screws 144 are respectively extended through the through holes 142 of the angled fan 14 to engage with the fins 124 at the slanted surface 126. A rotational axis (not labeled) of the angled fan 14 intersects the central portion (not labeled) of the base 122 of the heat sink 12.

In operation, the angled fan 14 blows cooling air into spaces between the fins 124 of the heat sink 12 at angles generally perpendicular to the slanted surface 126 of the heat sink 12 (see the arrows with broken lines in FIG. 1). Such air contacts a top surface (not labeled) of the base 122, and then deflects from the base 122 at acuate angles and subsequently exit the heat sink 12. Simultaneously, the system fan 20 generates horizontal cooling airflow toward the angled fan 14 and the heat sink 12 (see the arrows with unbroken lines in FIG. 1). Thus the heat dissipation assembly 10 and a system fan 20 cooperate to efficiently remove heat from the CPU 60.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat removal system comprising:
   a system fan attached to an opening of an enclosure and defining an inward airflow path; and
   a heat dissipation assembly in thermal contact with a heat-generating electronic device, said heat dissipation assembly including a heat sink with a base and a plurality of fins extending therefrom, said fins defining a slanted surface and supporting an angled fan thereon; wherein
      the system fan and the angled fan are substantially aligned with each other along a direction of said inward airflow path, and air flow coming from said system fan first hits the angle fan and is successively forcibly directed toward the base by said angled fan.

2. A heat removal system, comprising:
   a system fan adapted to be attached to an enclosure; and
   a heat dissipation assembly adapted to be in thermal contact with a heat-generating electronic device, the heat dissipation assembly comprising a heat sink and an angled fan, the heat sink having a base and a plurality of parallel fins extending upwardly from the base, the fins jointly defining a slanted surface for attachment of the fan thereat, wherein the slanted surface is perpendicular to the fins whereby cool air is blown into spaces between the fins and the base.

3. The heat removal system as described in claim 2, wherein a rotational axis of the fan intersects a portion of the base of the heat sink, which portion defines a region of highest temperature of the heat sink.

4. The heat removal system as described in claim 2, wherein the angled fan is generally box-shaped, and each corner of the angled fan defines a through hole therein for extension of a screw therethrough, thereby attaching the angled fan to the heat sink.

5. The heat removal system as described in claim 2, wherein the system fan is attached to a wall of the computer enclosure, such that the system fan is substantially opposite the angled fan.

6. A heat dissipation assembly, comprising:
   a heat sink comprising a base and a plurality of parallel fins extending therefrom, the fins jointly defining a slanted surface, wherein the slanted surface is perpendicular to the fins; and
   a fan attached to the slanted surface of the heat sink, a rotational axis of the fan intersecting a portion of the base of the heat sink, wherein cool air provided by the fan is straightly blown into spaces between the fins and the base.

* * * * *